United States Patent [19]

Perel

[11] 4,023,691
[45] May 17, 1977

[54] METHOD OF TRANSFERRING SEMI-CONDUCTOR DISCS BY A HINGED TRANSFER CARRIER

[75] Inventor: Richard Perel, Somerville, N.J.

[73] Assignee: United States Fused Quartz Company, Inc., Fairfield, N.J.

[22] Filed: Sept. 15, 1975

[21] Appl. No.: 613,626

[52] U.S. Cl. .............................. 214/152; 206/564; 211/126; 214/301; 221/93; 269/321 WE; 432/253

[51] Int. Cl.² ...................... A47F 1/08; F27D 5/00; F27D 15/00; G07F 11/48

[58] Field of Search ............ 214/301, 300, 1 B, 656, 214/152; 206/445, 72; 269/296, 321 WE; 211/41, 126; 221/69, 75, 82, 90, 93; 432/253, 258, 261, 86, 93, 239

[56] References Cited

UNITED STATES PATENTS

| | | | |
|---|---|---|---|
| 3,164,478 | 1/1965 | Bostrom | 206/445 |
| 3,294,244 | 12/1966 | Laughlin | 211/41 |
| 3,534,862 | 10/1970 | Shambelan | 211/41 |
| 3,610,613 | 10/1971 | Worden | 211/41 |
| 3,828,726 | 8/1974 | Dietze et al. | 269/296 |
| 3,926,305 | 12/1975 | Wallestad | 211/41 |
| 3,934,733 | 1/1976 | Worden | 214/301 |
| 3,949,891 | 4/1976 | Butler et al. | 214/301 |
| 3,961,877 | 6/1976 | Johnson | 432/253 |

Primary Examiner—Robert J. Spar
Assistant Examiner—Carl Rowold
Attorney, Agent, or Firm—Carella, Bain, Gilfillan & Rhodes

[57] ABSTRACT

Method and apparatus for transferring semi-conductor discs to and from a slab-form quartz boat which apparatus includes a carrier having a pair of hingedly attached shells having a plurality of opposed slots; the method including the receiving and discharge of discs by and from the slots in the carrier, into and from cooperative slots in the said quartz boat by the pivotal opening and closing of the shells of the carrier.

2 Claims, 6 Drawing Figures

METHOD OF TRANSFERRING SEMI-CONDUCTOR DISCS BY A HINGED TRANSFER CARRIER

BACKGROUND OF THE INVENTION

This invention relates generally to the manufacture of semi-conductor discs or wafers, and specifically, to methods of and apparatus for transfer of a plurality of said discs to and from a slab-form quartz boat or its equivalent during various stages of the manufacturing process.

Slotted carriers have been widely used in the electronics manufacturing arts for transferring a plurality of semi-conductor discs to and from quartz boats during various stages of the manufacturing process. For example, discs may be placed in the carrier during an ancillary stage of their manufacturing process, e.g. an acid bath, and then transferred to a quartz boat for a different stage of the process, e.g. an epitaxial reaction. Two basic methods have been widely used for transferring the discs from the carrier to the boat. The first method entails positioning the boat over an open top of the carrier, and the inverting the carrier so that the discs fall from the carrier into the slots in the quartz boats. However, in this method a quartz cassette form boat or basket carrier is employed having either a trapezoidal or triangular cross-sectional configuration formed by either four or three parallel rails, the rail having grooves or slots to receive the edges of the discs. A second method is to transfer the discs individually by means of tweezers from the carrier to the boat by lifting each disc from the carrier and depositing it in an appropriate slot in the boat. This method is intolerably slow.

Indigenous to the two aforementioned methods of transfer is the damage that occurs to the discs. The impact, known as "clicking," which the edges of the discs receive in the conventional dump transfer technique tends to damage the circuits on the discs both by chipping of the edges and by damage to circuits on the discs from the shock of "clicking." It has been found in the industry that as many as four of the electronic circuits applied to the discs can be irreparably damaged with each "clicking," and the expense incurred in this damage has proven to be significant. The use of tweezers can also damage circuits at the point of tweezer contact. It will be recognized by those skilled in the art that it is desirable to minimize the expensive damage to the discs by minimizing "clicking" and tweezer contact while not increasing the time required for transfer. Yet, for over a decade no mechanically feasible means of transferring the discs has been devised which would not seriously and deleteriously affect efficiency of the manufacturing process.

SUMMARY OF THE INVENTION

It is an object of the present invention, therefore, to provide a method of and apparatus for transferring a plurality of semi-conductor discs to and from a quartz boat particularly of the slab or two rail variety so as to virtually eliminate "clicking" while not increasing labor or time.

This object and others not enumerated are achieved by the apparatus and methods of the present invention, one embodiment of the apparatus including a transfer carrier comprising two slotted shells hingedly secured to each other. The preferred method comprising positioning the transfer carrier above a slab boat, and opening and closing the shells about the hinge or hinges to grasp or release the semi-conductor discs into or from the slots of the shells.

BRIEF DESCRIPTION OF THE DRAWINGS

A more complete understanding of the present invention may be had from the following detailed description thereof, particularly when read in the light of the accompanying drawings of a preferred embodiment of the invention, wherein.

DETAILED DESCRIPTION

Figure 1:
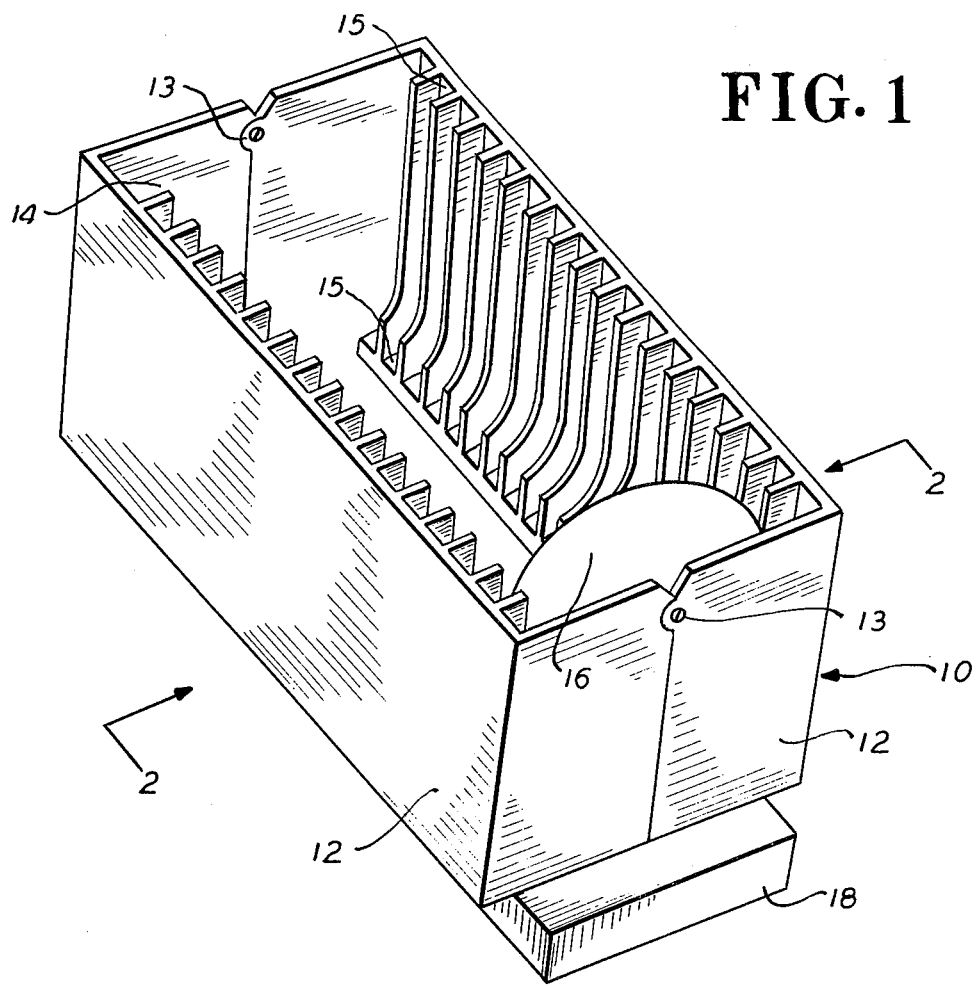
FIG. 1 is a perspective view of a carrier employed to practice the claimed method of the present invention.

Referring now to FIG. 1, a hinged and slotted carrier manufactured in accordance with the teachings of the present invention to designated generally by the reference numeral 10. The carrier 10 comprises two shells 12—12 which are pivotally secured to each other by hinges 13—13 and define a top opening 14. The shells 12—12 are each provided with a plurality of slots 15, 15, etc. perpendicular to opening 14 when the shells are in a closed configuration as shown in FIG. 1. The slots 15, 15 are cylindrically concave near the bottom of the carrier 10 so as to conform to the curvature of semi-conductor discs 16, 16 so that each disc 16 nests in slot 15 in stable equilibrium.

FIG. 1 shows the carrier 10 in perspective holding one semi-conductor disc 16. However, the carrier 10 is provided with enough slots 15 so that a plurality of semi-conductor discs 16 can be accommodated parallel to each other. In practice, carriers and boats are employed having a wide variety of different numbers of slots. The number of slots in the boat carriers is optional so long as they are spaced apart equal distances in cooperative or mating boats and carriers.

Figure 2:
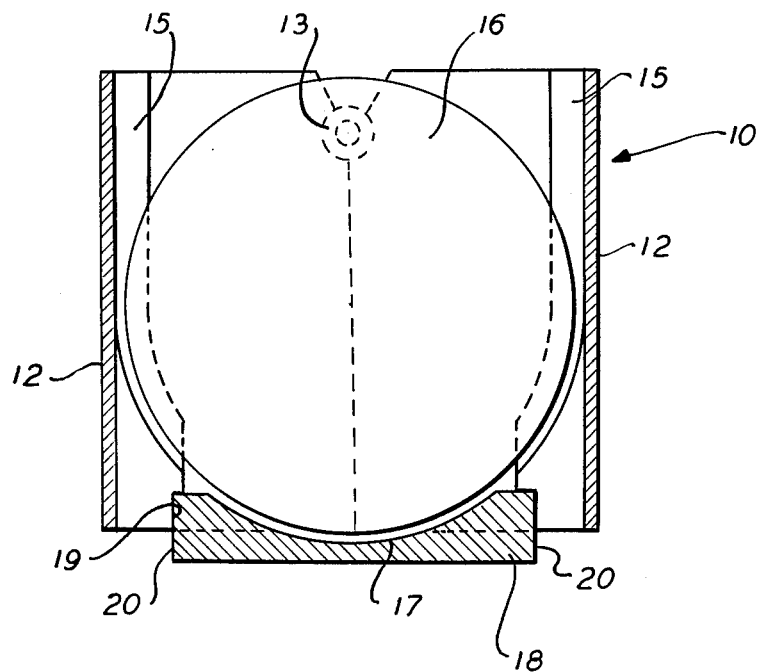
FIG. 2 is a side elevational cross-sectional view of the carrier and a slab boat taken along the plane 2—2 of FIG. 1, showing the carrier and boat in relation to a semi-conductor disc.
Figure 4:
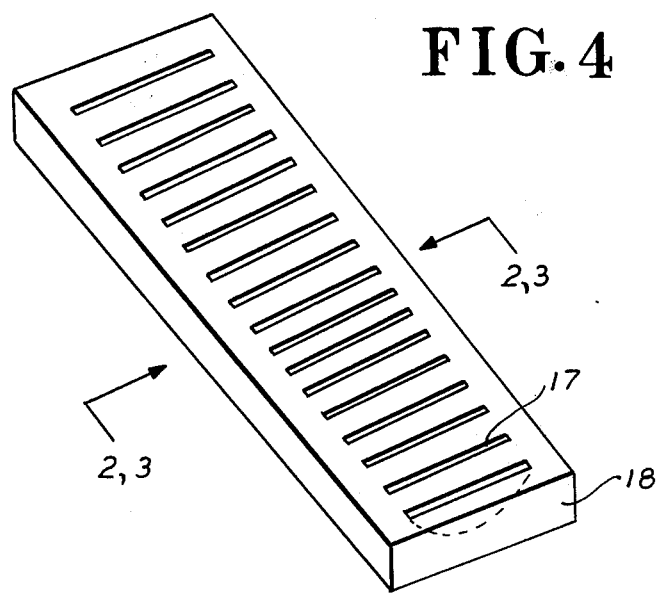
FIG. 4 is a perspective view of a slab boat as used in conjunction with the present invention.

At the initial stage of manufacturing, the discs 16 can be loaded into the carrier through its top opening 14. Each disc 16 is seated within a cooperative slot 15 in the carrier 10 with its edge resting on the concave portion proximal to the bottom. FIG. 2 shows a cross-sectional view of carrier 10 with a disc 16 seated in a pair of opposing slots 15—15 of the carrier 10 and a cooperative slot 17 of a slab boat 18.

The spacing in the drawing between the perimeter of the disc 16 and the supporting concave portion of the slots 15—15 is exaggerated for purposes of illustration. Likewise exaggerated is the distance between the perimeter of the disc 16 and the slot 17 in the quartz boat 18.

Figure 3:
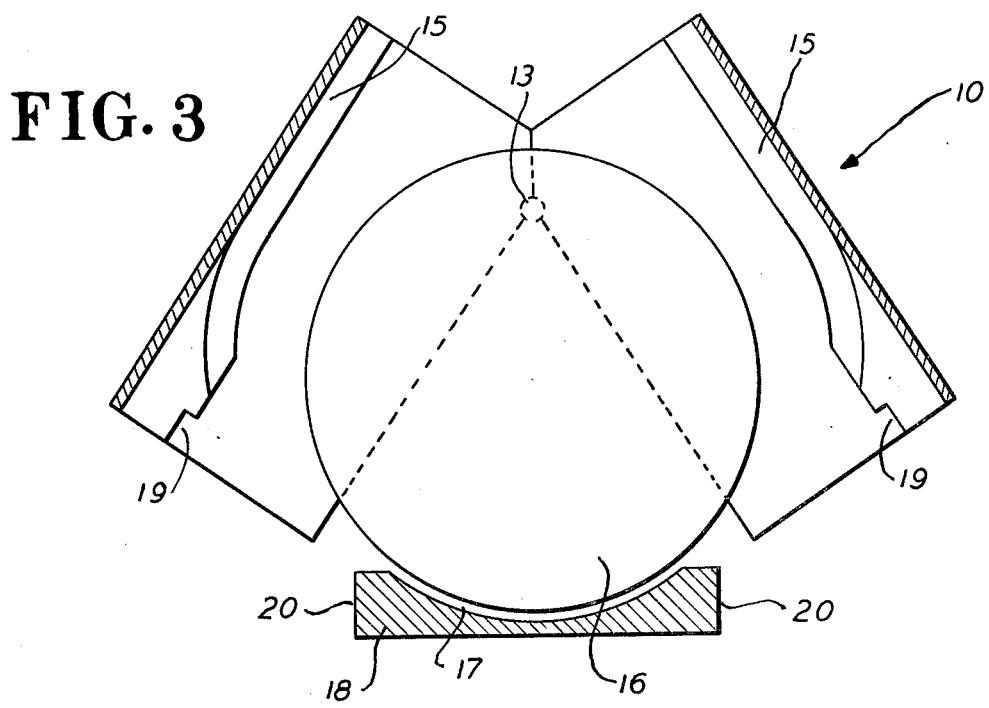
FIG. 3 is a side elevational cross-sectional view, similar to the view of FIG. 2, but showing the carrier in an open position.

Transfer of the discs 16—16 from the carrier 10 to the quartz boat 18 is accomplished by positioning the carrier 10 over the quartz boat 18 as shown in the cross-sectional view of FIG. 2 with the bottom of each disc 16 in vertical registration with a slot 17 in the boat 18. The transfer is effected when the shells 12—12 of the carrier 10 are opened by pivoting about hinges 13—13. FIG. 3 illustrates the position of the carrier 10, the disc 16 and the quartz boat 18 when the carrier 10 has been opened. At the stage of the operation as shown in FIG. 3, the carrier 10 itself no longer has any contact with the disc 16 and can be lifted out of the way. Transfer of the disc 16—16 from the quartz boat 18 to the carrier 10 can be effected by a reversal of the aforementioned operation. The carrier 10 is positioned over the slab boat 18 as shown in FIG. 3, and then closed as shown in FIG. 2 to entrap the discs 16, 16 in opposing slots 15, 15 in the carrier 10. The carrier 10 is then lifted away from the boat 18 with the discs 16, 16 seated therewithin.

The bottom of each shell 12 is preferably provided with a depending flange 19 is adapted to lying parallel to each side edge 20, 20 of the boat 18 to function as a positioning guide.

The carrier 10 is fabricated of a material selected so as to insure minimal impact damage to the edges of the discs 16 and to be inert in the manufacturing processes. In practice, polyetrafluorethylene (Teflon) has proved satisfactory.

Figure 5:
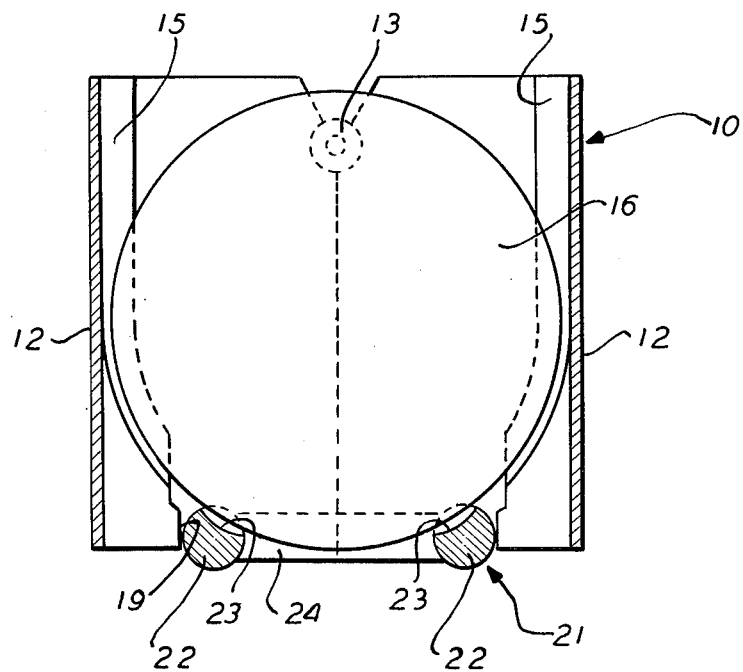
FIG. 5 is a perspective view of an alternate form of boat known as a "rail boat" which, for the purpose of this invention, is equivalent to the slab boat of FIG. 4.
Figure 6:
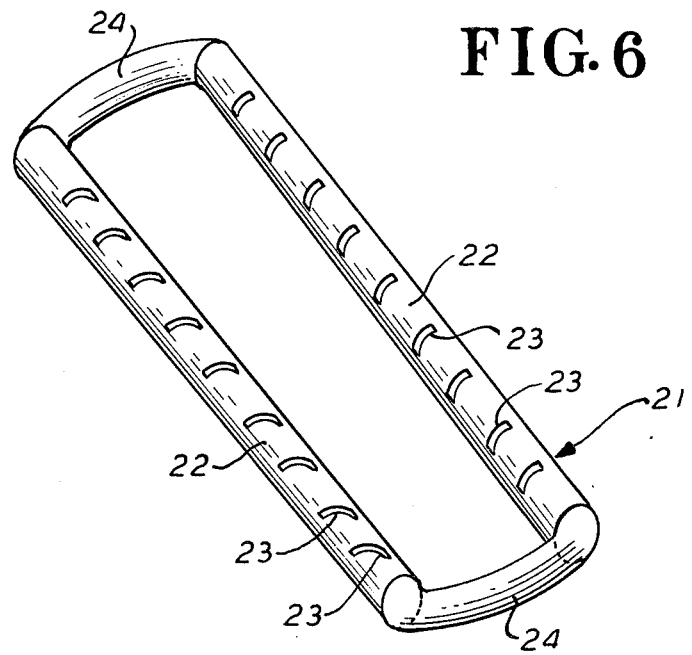
FIG. 6 is a side elevational view of the carrier and a rail boat, with the carrier in the closed position as shown in FIG. 2.

A rail type boat 21 is illustrated in FIGS. 5 and 6, and, for the purposes of this application is the equivalent of the slab boat 18 illustrated in FIGS. 1 to 4.

The rail boat 21 comprises a pair of parallel, spaced-apart quartz rails 22—22 having generally opposed slots 23—23. The rails 22—22 are connected by end cross-members on struts 24—24.

The edge of each disc 16 seats within opposed slots 23—23 in the rails 22—22, the slots being positioned to generally conform to the edge of the disc 16 when in a stable nesting position.

Otherwise the use of rail boat 21 is identical to slab boat 18.

It is evident that the method of and apparatus for transferring semi-conductor discs to and from a quartz boat, as disclosed in the present invention, minimize impact or "clicking" by positioning the device, discs, and boat so as to secure the discs in the structure into which they are to be transferred prior to release of the discs from the structure in which they are borne.

Although the method of and apparatus for conveyance and transfer of a plurality of semi-conductor discs to and from a quartz boat according to the present invention has been described with respect to but a single embodiment of apparatus, it will be recognized by those skilled in the art that modifications and variations to be disclosed apparatus may be made without departing from the spirit of the method and apparatus of the disclosed invention.

What is claimed is:

1. A method for transferring a plurality of semi-conductor discs between a carrier and a slotted boat comprising:
    a. positioning a disc carrier above a cooperative boat, the carrier comprising a pair of shells hingedly secured together, each shell having a plurality of internal disc receiving slots in general opposition to similar slots in the other shell, the shells having means to entrap discs within said internal slots thereof when the shells are pivoted into closed configuration, the boat having a plurality of cooperative slots in general opposition to the bottom of the carrier,
    b. the carrier and boat being positioned with respect to each other so that all discs are simultaneously in registration with the slots in the shells and the boat,
    c. pivoting the shells toward and away from each other to alternately engage and trap the discs in the opposed slots thereof and release and discharge the discs therefrom to the slots of the boat.

2. A method for transferring a plurality of semi-conductor discs between a carrier and a slotted boat in accordance with claim 1 in which
    a. the bottom edges of the discs are positioned within the slots on the boat before the shells are pivotally moved away from each other.

* * * * *